(12) United States Patent
Tai et al.

(10) Patent No.: US 11,461,050 B2
(45) Date of Patent: Oct. 4, 2022

(54) MANAGING DATA LIFECYCLES THROUGH DECAY

(71) Applicant: VMware, Inc., Palo Alto, CA (US)

(72) Inventors: Amy Tai, Palo Alto, CA (US); Michael Wei, Palo Alto, CA (US)

(73) Assignee: VMware, Inc., Palo Alto, CA (US)

( * ) Notice: Subject to any disclaimer, the term of this patent is extended or adjusted under 35 U.S.C. 154(b) by 74 days.

(21) Appl. No.: 17/153,265

(22) Filed: Jan. 20, 2021

(65) Prior Publication Data

US 2022/0229590 A1    Jul. 21, 2022

(51) Int. Cl.
*G06F 3/06* (2006.01)

(52) U.S. Cl.
CPC .......... *G06F 3/0659* (2013.01); *G06F 3/0616* (2013.01); *G06F 3/0619* (2013.01); *G06F 3/0653* (2013.01); *G06F 3/0679* (2013.01)

(58) Field of Classification Search
CPC .... G06F 3/0659; G06F 3/0616; G06F 3/0619; G06F 3/0653; G06F 3/0679
See application file for complete search history.

(56) References Cited

U.S. PATENT DOCUMENTS

| 10,594,730 B1* | 3/2020 | Summers | H04L 63/0892 |
| 2002/0036939 A1* | 3/2002 | Tsai | G11C 29/50 |
| | | | 365/201 |
| 2010/0097855 A1* | 4/2010 | Bayle | G11C 16/0483 |
| | | | 365/185.24 |
| 2012/0268983 A1* | 10/2012 | Muralimanohar | |
| | | | G11C 13/0069 |
| | | | 365/163 |
| 2014/0372490 A1* | 12/2014 | Barrus | G06F 16/1873 |
| | | | 707/814 |
| 2015/0106667 A1* | 4/2015 | Zeng | G11C 16/3459 |
| | | | 714/704 |
| 2016/0071589 A1* | 3/2016 | Thomas | G11C 13/0097 |
| | | | 365/148 |
| 2022/0012121 A1* | 1/2022 | Xu | G06F 11/10 |

OTHER PUBLICATIONS

Alagappan et al., "Protocol-aware recovery for consensus-based distributed storage," ACM Transactions on Storage (TOS), Oct. 2018, 14(3):1-30.

(Continued)

*Primary Examiner* — Hiep T Nguyen
(74) *Attorney, Agent, or Firm* — Fish & Richardson P.C.

(57) ABSTRACT

Methods, systems, and apparatus, including computer programs encoded on computer storage media, for enforcing a decay policy for a data object. One of the methods includes receiving a request to store a data object in a storage device; obtaining a user policy identifying a lifetime of the data object; determining, using the lifetime of the data object, a voltage policy for a plurality of memory cells of the storage device, wherein: each of the plurality of memory cells will store one or more bits of the data object; the voltage policy identifies a voltage to provide each memory cell; and an expected time at which raw bit errors of the data object will cause the data object to decay is equal to a time point identified by the lifetime of the data object; and storing the data object in the storage device according to the determined voltage policy.

21 Claims, 4 Drawing Sheets

(56) References Cited

OTHER PUBLICATIONS

Bjørling et al., "LightNVM: The Linux open-channel SSD subsystem," 15th USENIX Conference on File and Storage Technologies (FAST 17), 2017, pp. 359-374.

Cai et al., "Data retention in MLC NAND flash memory: Characterization, optimization, and recovery," 2015 IEEE 21st International Symposium on High Performance Computer Architecture (HPCA), Feb. 7-11, 2015, pp. 551-563.

Cai et al., "Error characterization, mitigation, and recovery in flash-memory-based solid-state drives," Proceedings of the IEEE, Sep. 2017, 105(9):1666-1704.

Cai et al., "Error patterns in MLC NAND flash memory: Measurement, characterization, and analysis," Proceedings of the IEEE, Mar. 12-16, 2012, pp. 521-526, 6 pages.

Cai et al., "Flash correct-and-refresh: Retention-aware error management for increased flash memory lifetime," 2012 IEEE 30th International Conference on Computer Design (ICCD), Sep. 30-Oct. 3, 2012, pp. 94-101.

congress.gov, "Health Insurance Portability and Accountability Act of 1996," Public Law 104-191, Aug. 21, 1996, retrieved on Aug. 27, 2021, retrieved from URL <https://www.congress.gov/104/plaws/publ191/PLAW-104publ191.pdf>, 169 pages.

dami.army, "Dod 5220.22-m, national industrial security program operating manual," Department of Energy and Department of Defense NRC, Jan. 1995, retrieved on Aug. 27, 2021, retrieved from URL <https://www.dami.army.pentagon.mil/site/IndustSec/docs/DoD%20522022-m.pdf>, 96 pages.

eur-lex.europa.eu, "Regulation (eu) 2016/679 of the european parliament and of the council of Apr. 27, 2016 on the protection of natural persons with regard to the processing of personal data and on the free movement of such data, and repealing directive 95/46/ec (general data protection regulation)," Official Journal of the European Union, Apr. 27, 2016, retrieved on Aug. 27, 2021, retrieved from URL <https://eur-lex.europa.eu/legal-content/EN/TXT/PDF/?uri=CELEX:32016R0679>, 88 pages.

Ganesan, "Redundancy does not imply fault tolerance: Analysis of distributed storage reactions to single errors and corruptions," 15th USEN1X Conference on File and Storage Technologies (FAST 17), 2017, pp. 149-166.

Geambasu et al., "Vanish: Increasing data privacy with self-destructing data," USENIX Security Symposium, 2009, 316:299-350.

Gutmann, "Secure deletion of data from magnetic and solid-state memory," Proceedings of the Sixth USENIX Security Symposium, San Jose, CA, 1996, 14:77-89, 15 pages.

Hales, "The NSA back door to NIST," Notices of the AMS, Feb. 2014, 61(2):190-192.

Haratsch, "NAND flash media management algorithms," Flash Memory Summit, Santa Clara, Ca, 2016, retrieved on Aug. 27, 2021, retrieved from URL <https://www.flashmemorysummit.com/English/Collaterals/Proceedings/2016/20160808_PreConfH_Haratsch.pdf>, 23 pages.

kernel.org, "FUSE," retrieved on Aug. 27, 2021, retrieved from URL <https://www.kemel.org/doc/html/latest/filesystems/fuse.html>, 9 pages.

Kissel et al., "Guidelines for Media Sanitization," NIST Special Publication 800-88 rev. 1., 2006, 43 pages.

law.justia.com, "The California Consumer Privacy Act of 2018. California Civil Code, Section 1798.100," 2018, retrieved on Aug. 27, 2021, retrieved from URL <https://law.justia.com/codes/california/2018/code-civ/division-3/part-4/title-1.81.5/section-1798.100/>, 2 pages.

Li et al., "Sentinel Cells Enabled Fast Read for NAND Flash," Proceedings of the 11th USENIX Conferences on Hot Topics in Storage and File Systems, Jul. 2019, 7 pages.

Lu et al., "Making disk failure predictions SMARTer!" 18th USENIX Conference on File and Storage Technologies (FAST 20), 2020, pp. 151-167.

Luo et al., "Heatwatch: improving 3d nand flash memory device reliability by exploiting self-recovery and temperature awareness," 2018 IEEE International Symposium on High Performance Computer Architecture (HPCA), Feb. 24-28, 2018, pp. 504-517.

Meza et al., "A large-scale study of flash memory failures in the field," Proceedings of the 2015 ACM SIGMETRICS International Conference on Measurement and Modeling of Computer Systems, Portland, Oregon, 2015, pp. 177-190.

Narayanan et al., "SSD failures in Datacenters: What? When? and Why?" Proceedings of the 9th ACM International on Systems and Storage Conference, Jun. 6, 2016, 11 pages.

Ouyang et al., "SDF: software-defined flash for web-scale internet storage systems," Proceedings of the 19th international conference on Architectural support for programming languages and operating systems, Feb. 24, 2014, pp. 471-484.

Perlman, "File system design with assured delete," Third IEEE International Security in Storage Workshop (SISW'05), Dec. 13, 2005, 7 pages.

Perlman, "The Ephemerizer: Making data disappear," SMLI TR-2005-104, Feb. 2005, 20 pages.

Perlroth et al., "N.S.A. able to foil basic safeguards of privacy on web," The New York Times, Sep. 5, 2013, 8 pages.

postgresql.org, "Postgresql's handling of fsync( ) errors is unsafe and risks data loss atleast on xfs," dated Mar. 28, 2018, retreived on Aug. 27, 2021, retrieved from URL <https://www.postgresql.org/message-id/flat/CAMsr%2BYHh%2B5Oq4xziwwoEfhoTZgr07vdGG%2Bhu%3D1adXx59aTeaoQ%40mail.gmail.com>, 97 pages.

Reardon et al., "Sok: Secure data deletion," Proceedings of the IEEE Symposium on Secruity, May 19-22, 2013, pp. 301-315.

Schroeder et al., "Disk failures in the real world: What does an MTTF of 1,000,000 hours mean to you," USENIX Conference on File and Storage Technologies (FAST), 2007, 16 pages.

Schroeder et al., "Flash reliability in production: The expected and the unexpected," 14th USENIX Conference on File and Storage Technologies (FAST 16), 2016, pp. 67-80.

Shah et al., "Analyzing the impact of GDPR on storage systems," 11th USENIX Workshop on Hot Topics in Storage and File Systems (HotStorage 19), 2019, 7 pages.

Shastri et al., "Understanding and benchmarking the impact of GDPR on database systems," Proceedings of the VLDB Endowment, 2020, 13(7):1064-1077.

shattered.io, "Shattered," available on or before Feb. 23, 2017, retrieved on Aug. 27, 2021, retrieved from URL <https://shattered.io/>, 8 pages.

Strom et al., "Hard disk drive reliability modeling and failure prediction," IEEE Transactions on Magnetics, Aug. 20, 2007, 43(9):3676-3684.

Tai et al., "Who's afraid of uncorrectable biterrors? Online recovery of flash errors with distributed redundancy," 2019 USENIX Annual Technical Conference (USENIS ATC 19), 2019, pp. 977-992.

Wei et al., "Reliably erasing data from flash-based solid state drives," USENIX Conference on File and Storage Technologies (FAST), 2011, 13 pages.

Wolchok et al., "Defeating vanish with low-cost sybil attacks against large DHTs," Proc. 17th Network and Distributed System Security Symposium (NDSS), Feb.-Mar. 2010, 15 pages.

\* cited by examiner

MANAGING DATA LIFECYCLES THROUGH DECAY

BACKGROUND

This specification generally relates to data storage systems.

A common architecture for data storage virtualization is a redundant array of independent disks (RAID), where multiple disk drives, also called simply "disks," are combined into a single logical unit for the purpose of data redundancy and/or parity.

Many existing storage systems expend significant computational and memory resources ensuring that the data objects stored in the storage system will be available indefinitely, executing costly procedures to preclude the data objects from decaying. Often, the only way for a data object to be removed from the storage system is for the storage system to execute an explicit delete or overwrite command, e.g., in response to a user instruction to remove the data object. Some existing storage systems allow users to schedule data object to be deleted at a particular future time point, e.g., using a cron job; these implementations still require the storage system to execute an explicit delete command.

SUMMARY

This specification generally describes a storage system that supports the automatic decay of data according to a predetermined lifetime of the data. For each data object received by the storage system, the storage system can generate a "decay policy" that identifies one or more procedures, to be executed by the storage system, that will enforce the lifetime of the data object.

In this specification, the lifetime of a data object defines a time period in which the data object should be available for retrieval from a storage system. In some cases, the lifetime can be defined by a single "time-to-live" value that represents a time point from the creation of the data object after which the data object should be unavailable. In some other cases, the lifetime can be defined by a "minimum time-to-live" value and a "maximum time-to-live" value that collectively represent a window of time after the creation of the data object during which the data object should become unavailable. That is, the predetermined lifetime of the data object requires that before the time point represented by the minimum time-to-live, the data object should be available; after the time point represented by the minimum time-to-live and before the time point represented by the maximum time-to-live, the data object may or may not be available; and after the time point represented by the maximum time-to-live, the data object should be unavailable.

In this specification, data decay is a process whereby data becomes unrecoverable over time, without active processing of the data by the storage system. For example, data decay can occur without issuing any deletion commands or overwrite commands of the data.

The procedures identified by the decay policy can cumulatively enforce the lifetime of the data object, i.e., cause the data object to decay at a rate corresponding to the lifetime of the data object. Each procedure can be executed by a respective layer of a storage stack of the storage system. For example, the decay policy can define an undervolting procedure whereby a device layer of the storage system provides less voltage to the memory cells that store the data object, causing a raw bit error rate that contributes to the decay of the data object.

Particular embodiments of the subject matter described in this specification can be implemented so as to realize one or more of the following advantages.

As described above, some existing storage systems use significant computational and memory resources ensuring that data objects will be available indefinitely, even in situations where the data object will only need to be stored for a short period of time, e.g., an hour, a day, a week, or a month. In situations in which the lifetime of the data object is known when the data object is placed in the storage system, using these resources to ensure that the data object will be available long after the lifetime of the data object is wasteful. Using techniques described in this specification, a system can generate a decay policy that identifies policies that a storage system can implement to allow the data object to decay based on the lifetime of the data object, saving significant resources and improving the efficiency of the system. In particular, this specification describes techniques for expressing the lifetime of a data object and for implementing mechanisms to enforce the lifetime of the data object by leveraging the capabilities of one or more different layers of a storage stack. Furthermore, in some implementations, a storage system can enforce the lifetime of a data object automatically in a passive manner, i.e., without explicit delete or overwrite commands, further improving the efficiency of the storage system.

In many situations, the lifetime of a data object is dictated by one or more relevant compliance laws or regulations. For example, in the European Union, the General Data Protection Regulation (GDPR) identifies requirements for the storage of personal data. As another example, in the United States, the Health Insurance Portability and Accountability Act (HIPAA) regulates the storage of patient health data. As another example, in California, the California Consumer Privacy Act (CCPA) identifies requirements for the storage of personal data. Using techniques described in this specification, a storage system can generate and execute a decay policy that ensures that data objects have decayed within a timeframe required by relevant regulations.

In some implementations described herein, a storage system can establish a particular auto-decay policy as a "default" decay policy for all data objects stored in the storage system. That is, without explicit instructions otherwise, the storage system can enforce the default decay policy for each data object that the storage policy stores. In some such implementations, a user or external system can provide a different decay policy for a particular data object, or instructions that a particular data object is not to decay at all. Thus, the storage system can guarantee that no data object is stored beyond the time it is needed, and that the storage system is not violating relevant regulations with respect to the storage of any data object.

The media used by storage devices to store data objects naturally decay—no media is perfect in preserving data forever. Using some techniques described in this specification, a storage system can leverage the natural decay of its media to ensure that a data object decays according to a predetermined lifetime of the data object.

In some existing systems, a storage system can tag a data object with a time-to-live value, and when the storage system receives a read request for the data object, the storage system checks whether the time-to-live has passed. In some such existing system, a garbage collector can also periodically check whether the time-to-live has passed and, if so, reclaim the storage space of the data object. However, if the storage system has not received a read request for the data object and the garbage collector has not yet reclaimed the storage space, then the storage system can continue to store the data object, wasting resources and potentially violating privacy regulations. Using some techniques described in this specification, a storage system can ensure the decay of a data object, according to a predetermined lifetime of the data object, even in the absence of read requests or a garbage collector.

The details of one or more embodiments of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

This specification describes techniques for generating and enforcing a decay policy for a data object stored in a storage system.

Figure 1:
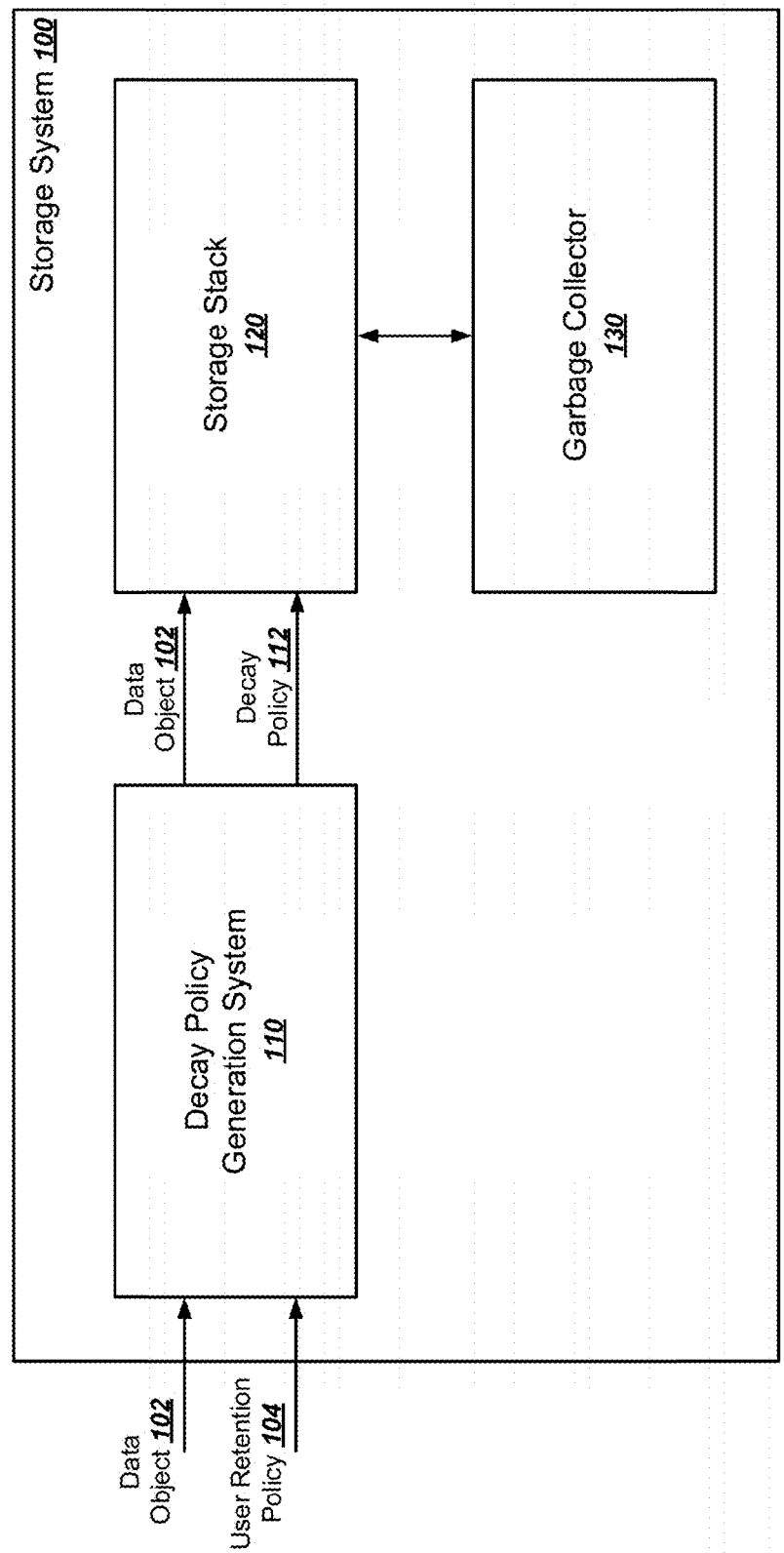
FIG. 1 is a diagram of an example storage system.

FIG. 1 is a diagram of an example storage system 100. The storage system 100 is an example of a system implemented as computer programs on one or more computers in one or more locations, in which the systems, components, and techniques described below can be implemented.

The storage system 100 includes a decay policy generation system 110, a storage stack 120, and a garbage collector 130.

The storage stack 120 is a stack of multiple software and/or hardware layers that are communicatively connected and that enable the storage system 100 to store data objects. A topmost layer of the storage stack 120 can receive a data object, and each layer of the storage stack 120 can process the data object and provide the processed data object to a lower layer in the stack 120. A lowest layer of the storage stack 120 can be a hardware device that physically stores the data object. As a particular example, the storage stack 120 can include one or more of an application layer, a file system layer, an interconnect layer, a RAID layer, and a device layer. An example storage stack is discussed in more detail below with reference to FIG. 2.

The storage system 100 is configured to receive (i) a data object 102 that is to be stored and (ii) a user retention policy 104 that defines parameters by which the data object 102 is to be stored. For example, the storage system can receive the data object 102 in a write request from a user device or an external system. In response to receiving the write request, the storage system 102 can store the data object 102 using the storage stack 120.

The user retention policy 104 can be defined by one or more users of the storage system 100, e.g., one or more system administrators of the organization that owns or uses the storage system 100. The user retention policy 104 can identify a lifetime of the data object 102.

In some implementations, the user retention policy 104 can be different for each received data object 102. That is, when providing a data object 102, the user of the user device or the external system can define a different user retention policy 104, e.g., by providing a user input that identifies the lifetime of the data object 102.

In some other implementations, the user retention policy 104 is the same for each received data object 102. That is, the user of the user device or the external system can define a single user retention policy 104, and the single user retention policy 104 is applied to each data object 102 that is subsequently stored in the storage system 100. For example, the storage system 100 can store data defining a default retention policy 104 and/or a default decay policy 112; then if the storage system 100 receives a data object 102 without a user retention policy 104 or other instructions for how the data object 102, the decay policy generation system 110 can generate a decay policy 112 from the default user retention policy 104, or use the default decay policy 112 to store the data object 102.

In some such implementations, the user retention policy 104 can identify multiple different options for the lifetime of a data object 102, where the particular lifetime that is assigned to a particular data object 102 depends on the qualities of the particular data object 102. For example, the user retention policy 104 can identify multiple categories of data objects 102, and a different lifetime for each category.

The decay policy generation system 110 is configured to receive the user retention policy 104 and to determine, from the user retention policy 104, a decay policy 112. The decay policy 112 is a policy that can be executed by the storage stack 120 to enforce the lifetime of the data object 102 through decay. In particular, the decay policy 112 identifies one or more procedures, to be executed by respective software and/or hardware layers of the storage stack 120, that collectively ensure that the data object 102 decays according to the lifetime of the data object 102. That is, if each procedure identified in the decay policy 112 is executed by the respective layer of the storage stack 120, then the data object 102 will decay as required by the lifetime of the data object 102 defined by the user retention policy 104.

In some implementations, the decay policy 112 provides a probabilistic guarantee for the lifetime of the data object 102. For example, the decay policy 112 can provide, for one or more time points after the data object 102 has been stored in the storage stack 120, a likelihood that the data object 102 will have decayed by the time point (i.e., that the data object will no longer be available at the time point). As a particular example, if the lifetime of the data object 102 is defined by a minimum time-to-live value and a maximum time-to-live value, then the decay policy 112 can guarantee that there is, e.g., a 10% probability that the data object 102 has decayed by the time point represented by the minimum time-to-live, and a 90% probability that the data object 102 has decayed by the time point represented by the maximum time-to-live. As another particular example, if the lifetime of the data object 102 is defined by a single time-to-live, then the decay policy 112 can guarantee that there is, e.g., a 50% probability that the data object 102 has decayed by the time point represented by the time-to-live. In other words, the storage system 100 may not provide a hard guarantee that the data object 102 will be available before the time-to-live and will not be available after the time-to-live. In some implementations, however, the decay policy 112 can provide a very strong probabilistic guarantee, e.g., with 99%, 99.9%, 99.99%, or 99.999% probability, that the data object 102 will have decayed within the lifetime of the data object 102. In some cases, such a strong probabilistic guarantee can satisfy the requirements of the user of the storage system 100, i.e., the ε% difference between the probabilistic guarantee and a hard guarantee can be inconsequential for the purposes of the user.

The user retention policy 104 can identify the guarantees of the availability of the data object 102 that are required. That is, the user retention policy 104 can identify whether a probabilistic guarantee as described above is acceptable (i.e., whether it is acceptable for there to be a small likelihood that the data object 102 will decay more slowly and/or more quickly than dictated by the lifetime), or whether a hard guarantee that the data object 102 will exactly satisfy the lifetime is required. In some such implementations, the user retention policy 104 can define the probabilistic guarantees that would be acceptable. For example, the user retention policy 104 can require that there be, e.g., a 10% probability or less that the data object 102 will have decayed by the minimum time-to-live and a 90% probability or more that the data object 102 will have decayed by the maximum time-to-live.

In some implementations, the decay policy generation system 110 selects, using the user retention policy 104, one or more procedures from a predetermined set of candidate procedures to be included in the decay policy 112. Each candidate procedure can be a process that a respective layer of the storage stack 102 is configured to execute and that contributes to the decay of a data object. The decay policy generation system 110 can select candidate procedures such that the selected procedures collectively enforce the lifetime of the data object 102 defined by the user retention policy 104. In other words, different predefined procedures can be composed together to generate the decay policy 112. Example procedures are discussed in more detail below with reference to FIG. 2.

One or more decay procedures identified by the decay policy 112 can relate to bit-level decay, i.e., where the data object 102 decays bit by bit. In some implementations, when generating the decay policy 112, the decay policy generation system 110 can determine a proportion of the data object 102 that must be incorrect for the data object 102 itself to be considered "decayed." That is, the decay policy generation system 110 can determine a minimum number of the bits of the data object 102 that must be lost before the data object 102 is considered decayed. In some implementations, the number of bits that must be lost for the data object 102 to decay can depend on the type of data of the data object 102. As a particular example, if the data object 102 is a computer program binary, then the decay policy generation system 110 might determine that only a few bits (e.g., 0.1%, 1%, or 5%) must be incorrect before the data object 102 has decayed. As another particular example, if the data object 102 is a video file, then the decay policy generation system 110 might determine that a relatively large proportion of the bits (e.g., 10%, 50%, or 90%) must be incorrect before the data object 102 has decayed. This higher proportion of decayed bits may be required since, even if a relatively large proportion of the bits of a video have decayed, it may still be possible to view a portion of the video The decay policy generation system 110 can provide the decay policy 112 to the storage stack 120, which can store the data object 102 using the decay policy 112. That is, the storage stack 120 can execute the procedures identified by the decay policy 112, thus allowing the data object 102 to decay according to the user retention policy 104.

After storing the data object 102 in the storage stack 120, the storage system can receive a read request from a user device (e.g., the same user device that submitted the write request or a different user device) or an external system (e.g., the same external system that submitted the write request or a different external system), where the read request references the data object 102.

In response to receiving the read request, if the lifetime of the data object 102 has not expired (i.e., according to the user retention policy 104 the data object 102 should still be available for reading), the storage system 100 can locate the data object 102 in the storage stack 120 and provide the data object 102 to the user device or external system that submitted the read request. If the lifetime of the data object 102 has expired (i.e., according to the user retention policy 104 the data object 102 should not be available for reading), the storage system 100 can decline to provide the data object 102 to the user device or external system that submitted the read request, e.g., by sending a notification that the data object 102 is no longer available.

In implementations in which the decay policy 112 enforces the lifetime of the data object 102 probabilistically as described above, in some cases, the data object 102 will have decayed even if the lifetime of the data object 102 has not yet expired. For example, if the lifetime of the data object 102 is defined by a single time-to-live value, then the data object 102 may expire before the time point represented by the time-to-live. As another example, if the lifetime of the data object 102 is defined by a minimum time-to-live value and a maximum time-to-live value, then then the data object 102 may expire before the time point represented by the maximum time-to-live.

In some such implementations, the storage system 100 can determine that the data object 102 has decayed, and send a notification to the user device or external system that submitted the read request that the data object 102 is no longer available.

In some other such implementations, the storage system 100 can attempt to recover the data object 102 when the time-to-live has not expired. For example, each layer of the storage stack 120 can pass (i) the decayed data object 102 and (ii) an exception identifying that the data object 102 is decayed to the next highest layer for further processing to attempt to recover the data object 102. This process is described in more detail below with reference to FIG. 2.

The garbage collector 130 is configured to reclaim unused storage space in the storage stack 120. The garbage collector 130 can use the decay policy 112 to determine whether or not to reclaim the storage space used to store the data object 102. For example, the garbage collector 130 can determine whether the lifetime of the data object 102 has expired and, if so, reclaim the storage space of the storage stack 120 used to store the data object 102. As a particular example, the respective decay policy for each data object stored in the storage system 100 can be stored as meta data of the storage system 100 and accessible to the garbage collector 130.

In some implementations, if the lifetime of the data object 102 has not expired, the garbage collector 130 can determine whether the data object 102 has decayed anyway and, if so, reclaim the storage space of the storage stack 120 used to store the data object 102. For example, the garbage collector 130 can read the data object 102 and determine whether it has decayed. Thus, the garbage collector 130 can leverage the decay policy 112 to reclaim storage space that would previously have been wasted, improving the efficiency of the storage system 100.

Figure 2:
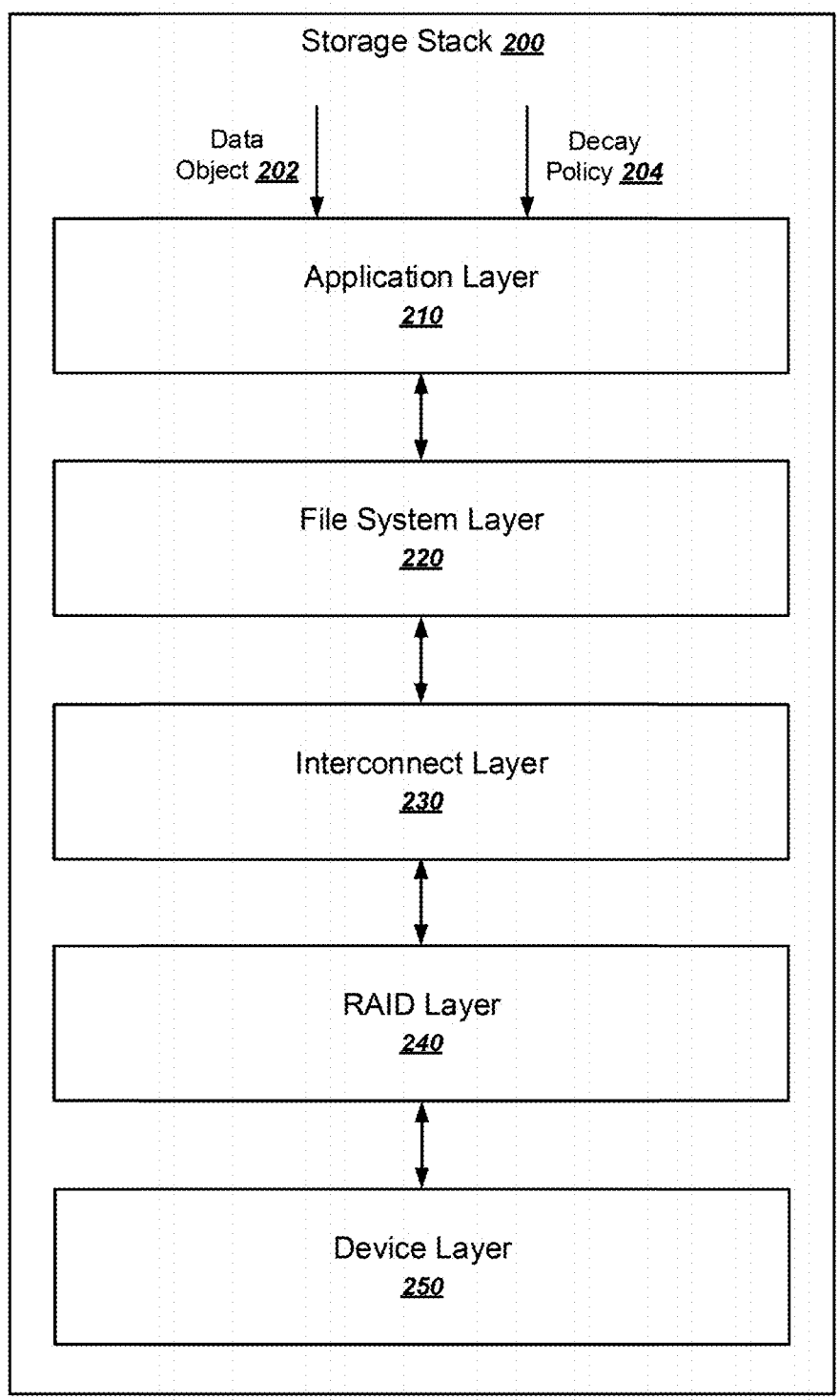
FIG. 2 is a diagram of an example storage stack.

FIG. 2 is a diagram of an example storage stack 200. The storage stack 200 is an example of a system implemented as computer programs on one or more computers in one or more locations, in which the systems, components, and techniques described below can be implemented.

The storage stack 200 can be a component of a storage system, e.g., the storage system 100 depicted in FIG. 1, that is configured to store data objects. In particular, the storage stack 200 is configured to receive a data object 202 and a decay policy 204 for the data object 202, and to store the data object 202 using the decay policy 204. That is, the storage stack 200 is configured to execute the decay policy 204 such that a predetermined lifetime of the data object 202 is enforced via decay.

The storage stack 200 includes an application layer 210, a file system layer 220, an interconnect layer 230, a RAID layer 240, and a device layer 250. In some implementations, the storage stack 200 includes one or more layers in addition to the layers depicted in FIG. 2. In some implementations, the storage stack 200 does not include one or more layers depicted in FIG. 2.

The decay policy 204 identifies one or more procedures that enforce the lifetime of the data object 202 through decay. Each procedure can be executed by a respective layer of the storage stack 200. In this specification, procedure for facilitating the decay of data objects, as identified in a decay policy, is also called "decay procedure"

The application layer 210 implements an application that receives and/or creates the data object 202. For example, the application layer 210 can implement a user application that is configured to receive a user input that includes the data object 202.

An example decay procedure that the application layer 210 can execute is eliminating one or more data integrity checks for ensuring the integrity of the data object 202. Typically, for each received data object, an application layer generates and stores one or more data integrity checks, which are items of data that can be used to verify that the data object has not been corrupted. For example, a data integrity check can be a checksum value, such as a cyclic redundancy check (CRC) value, a hash value, or a data fingerprint value. By generating data integrity checks for received data objects, the application layer 210 increases the likelihood that a corruption of the data object 202 will be caught and handled. Therefore, by ceasing to generate data integrity checks, the application layer 210 increases the likelihood that a corruption of the data object 202 will go undetected and remain unaddressed, increasing the likelihood that the data object 202 will decay.

Eliminating data integrity checks can also improve the memory efficiency of the application layer 210 (by freeing storage space that would have been used to store the data integrity checks), as well as the computational efficiency of the application layer 210 (by eliminating the operations that generate the data integrity checks and the operations that compare the data integrity checks against the corresponding data objects to verify the integrity of the data objects).

Another example decay procedure that the application layer 210 can execute is reducing or eliminating redundancy of the data objects. In some storage stacks, for each received data object, the application layer maintains multiple copies of the data object. This redundancy is propagated to each layer of the storage stack; that is, each copy of the data object maintained by the application layer requires redundant operations to be executed by the file system layer, RAID layer, etc. By eliminating this redundancy or reducing the number of redundant copies, the application layer 210 increases the likelihood that the data object will be lost, while improving the memory and computational efficiency of the storage stack 200.

The decay policy 204 might dictate that redundancy at the application layer 210 be reduced (e.g., by reducing the number of copies of the data object 202 from five to two) instead of eliminated because redundancy can ensure the availability of the data object 202. For example, if a component machine of the storage stack 200 becomes unavailable, or if there is a network failure, the application layer 210 can retrieve a copy of the data object 202 if the storage stack 200 receives a read request for the data object 202.

The file system layer 220 implements a file system that organizes the data objects 202 stored in the storage stack 200.

An example decay procedure that the file system layer 220 can execute is eliminating the maintenance of one or more types of metadata. For example, the file system layer 220 can eliminate the maintenance of undo logs related to the data object 202. An undo logs is a log related to a transaction that includes information about how to undo the transaction or a component of the transaction. By eliminating undo logs, the file system layer 220 can reduce the storage footprint of the data object 202 while increasing the likelihood that an error in the data object 202, e.g., an error that occurred during a transaction related to the data object 202 (e.g., an overwrite transaction) and that corrupted the data object 202, will be irreversible. As another example, the file system layer 220 can eliminate journaling, which is a process that tracks changes to the data object 202 that have not yet been fully committed to the file system. By eliminating journaling, the file system layer 220 can reduce the storage footprint of the data object 202 while increasing the likelihood that the data object 202 (or a change to the data object 202) will be lost before it can propagate through the file system, e.g., in response to an unexpected shutdown.

Another example decay procedure that the file system layer 220 can execute is eliminating one or more data integrity checks. Similar to the application layer 210, the file system layer 220 can generate and maintain one or more data integrity checks (e.g., checksum values, CRC values, or hash values) for each received data object. By eliminating these, the file system layer 220 can decrease the likelihood that a corruption of the data object 202 will caught and handled, while reducing the storage footprint of the data object 202.

The interconnect layer 230 implements a communication protocol between (i) a first device (or system of devices) that hosts the application layer 210 and the file system layer 220 and (ii) a second device (or system of devices) that hosts the RAID layer 240 and the device layer 250. For example, the interconnect layer 230 can implement the Serial Advanced Technology Attachment (SATA) standard or the Peripheral Component Interconnect express (PCIe) standard. In some implementations, the same device hosts each layer of the storage system 200. For example, the interconnect layer 230 can provide a communication link between a storage component of the device and the driver of the device. Since the interconnect layer 230 represents a communication link between respective other layers, in some implementations the decay policy 204 does not identify any decay procedures to be executed by the interconnect layer 230.

The RAID layer 240 includes multiple disks that are configured to provide redundancy and/or parity for the storage system. There are multiple different RAID levels that each define a different procedure for distributing data across the multiple disks.

One common RAID level is RAID-1, where each item of data written to the storage system is copied, or "mirrored," at least once. For example, there might be three disks in a RAID-1 array, where all of the data written to the first disk is mirrored to the second and third disks. Thus, every disk except one in a RAID-1 array can fail and the system can restore the data without data loss. This fault tolerance comes at the cost of space efficiency and write efficiency. That is, with n disks, a RAID-1 array has a usable capacity of $1/n^{th}$ the capacity of the array, and every write operation requires n operations to amplify the write across the array.

Another common RAID level is RAID-5, where multiple "primary" disks store data that is supported by a "parity" disk. The parity disk provides fault tolerance to the primary disks, so that if a primary disk fails, a system can restore the data of the failed primary disk without data loss. RAID-5 allows for a single disk failure (either a primary disk or the parity disk) without loss of data. Another common RAID level is RAID-6, where multiple primary disks store data that is supported by two parity disks. RAID-6 allows for up to two disk failures, across the primary disks and the parity disks, without loss of data. The fault tolerance of RAID-5 and RAID-6 comes at the cost of lower capacity and write efficiency. For instance, a RAID-6 array might have 4 primary disks and 2 parity disks. In this case, the usable capacity of the array is ⅔rds the capacity of the array. To write to a single block of a primary disk of the array requires 6 read and write operations: the system must (i) read the current value of the block of the primary disk and the current values of the corresponding blocks of the two parity disks, (ii) compute an update to the values of the blocks of the parity disks given the new data in block of the primary disk, and (iii) write the new data to the block of the primary disk and the new values to the blocks of the two parity disks.

An example decay procedure that the RAID layer 240 can execute is reducing the redundancy of the array of disks of the RAID layer 240. For example, if the RAID layer 240 includes a RAID-1 array of disks, then the decay procedure can identify the number of mirrored disks in the RAID-1 array that should be used to store the data object 202. As a particular example, if the RAID layer 240 typically stores data objects in a RAID-1 array with three disks (i.e., three copies of each item of data are stored), then the decay procedure can instruct the RAID layer 240 to store the data object 202 in a RAID-1 array with two disks (i.e., two copies of each item of data are stored) instead of the RAID-1 array with three disks, thus reducing the redundancy of the storage of the data object 202 from three to two. Reducing the redundancy in a RAID-1 array can improve the space and write efficiency of the RAID layer 240, while increasing the likelihood that the data object 202 will be lost.

Another example decay procedure that the RAID layer 240 can execute is reducing the parity of the array of disks of the RAID layer 240. For example, if the RAID layer 240 typically stores data objects in a RAID-6 array of disks (that includes two parity disks), then the decay procedure can instruct the RAID layer 240 to store the data object 202 in a RAID-5 array of disks (that includes one parity disk) instead of the RAID-6 array of disks, thus reducing the number of parity disks used to store the data object 202 from two to one. Reducing the parity in the RAID layer 204 can improve the space and write efficiency of the RAID layer 240, while increasing the likelihood that the data object 202 will be lost.

The device layer 250 represents the one or more physical hardware devices on which the data objects of the storage stack 200 are stored.

An example decay procedure that the device layer 250 can execute is using weaker error-correcting code within the device layer 250 (or, not using error-correcting code at all). Error-correcting code is code that the device layer 250 can run to identify and correct corruptions of the data object 202, e.g., single-bit errors. A first set of error correcting code can be considered "stronger" than a second set of error correcting code if the first set is capable of recovering a data object that has a higher proportion of incorrect bits than the second. As a particular example, some error-correcting codes in the Bose-Chaudhuri-Hocquenghem (BCH) family of codes are weaker than some error-correcting codes in the low-density parity-check (LDPC) family of codes.

Often, stronger error-correcting code requires a higher level of redundancy of the bits of the data object, and therefore increases the storage footprint of the data object. Furthermore, stronger error-correcting code is often more computationally intensive than weaker error-correcting code. Therefore, using weaker error-correcting code (or no error correcting code) can improve the memory and computational efficiency of the device layer 250 while increasing the likelihood that the data object 202 will be corrupted.

A decay policy generation system, e.g., the decay policy generation system 110 depicted in FIG. 1, can select an error correcting code for the data object 202 according to the lifetime of the data object 202, increasing the strength of the code (and thus decreasing the memory and computational efficiency of storing the data object 202) for longer lifetimes of the data object 202. As a particular example, selecting an error-correcting code that adds 3% storage overhead to the storage of the data object 202 can decrease the error rate of the data object 202 by 5-10 orders of magnitude.

Another example decay procedure that the device layer 250 can execute is eliminating read retries. When the device layer 250 fails to correctly read the data object 202 a first time, the layer 250 can issue a read retry, which is a second (and sometimes third, fourth, and so on) attempt at reading the data object 202, often with different parameters than the first read attempt (e.g., a change in the voltage threshold). If the device layer 250 eliminates read retries, then the device layer 250 would determine that the data object 202 has decayed and is unavailable after a single unsuccessful attempt to read the data object 202. Thus, eliminating read retries can improve the computational efficiency of the device layer 250 while decreasing the likelihood that the data object 202 will be available to be read by a user or an external system.

Another example decay procedure that the device layer 250 can execute is eliminating the "refreshing" of the data object 202. Refreshing a data object is a process in which the device layer 250 periodically rewrites the data object so that the data will persist longer. Eliminating this refresh process can improve the computational efficiency of the storage stack 200 while improving the lifetime of the devices of the device layer 250, because the refresh process is taxing on the hardware, reducing the lifetime of the devices.

Another example decay procedure that the device layer 250 can execute is implementing voltage policy specified by the decay policy 204 that identifies a voltage to provide the cells of the hardware of the device layer 250 used to store the data object 202. For example, the device layer 250 can include a solid-state drive with cells that each store one or a few bits of a data object. Each cell can be provided a voltage to maintain the value of the one or more bits stored in the cell, and the voltage provided can dictate a bit error rate of the cell, i.e., a likelihood that the bit values maintained by the cell will be lost. This process is discussed in more detail below with reference to FIG. 3.

In some implementations, the storage stack 200 can experimentally determine the effect, on the decay rate of a data object, of executing one or more of the above decay procedures. That is, for each of the one or more decay procedures, the storage stack 200 can determine the marginal change to the decay rate of a data object when the decay procedure is executed. In some cases, the effect on the decay rate can depend on the type of the data object, the required lifetime of the data object, and/or the size of the data object. In some cases, the effects on the decay rate of an object of multiple respective decay procedures can be dependent; that is, when executed together, the multiple decay procedures can have an effect on the decay rate of the data object that is different than the summation of the effects when the decay procedures are executed individually. A particular example of experimentally determining the effect of a voltage policy on the decay rate of a data object is discussed in more detail below, with reference to FIG. 3.

Then, given the respective effects of each decay procedure, given a particular data object with a particular lifetime, a decay policy generation system, e.g., the decay policy generation system 110, can compose a set of decay procedures such that the cumulative effect on the decay rate of the particular data object will enforce the particular lifetime. As a particular example, the decay policy generation system may prefer including decay procedures to be executed lower in the storage stack (e.g., by the device layer 250) than higher in the storage stack (e.g., by the application layer 210). In this example, the decay policy generation system can begin adding decay procedures to the decay policy for the particular data object from lower in the storage stack 200 and working upward, until the predicted cumulative effect of the decay procedures added to the decay policy is equal to the particular lifetime.

In some implementations in which the lifetime of the data object identifies a minimum time-to-live and a maximum time-to-live, the storage stack 200 begins executing the procedures identified by the decay policy 204 after the time point represented by the minimum time-to-live. That is, the storage stack 200 can operate according to a default setting (e.g., with full redundancy, parity, error correcting code, etc.) from the time point at which the data object 202 is stored in the storage stack 200 until the time point represented by the minimum time-to-live. Then, at the time point represented by the minimum time-to-live, the storage stack 200 can begin enforcing the decay policy 204 (e.g., by reducing redundancy, parity, error correcting code, etc., as described above). In some other implementations, the storage stack 200 begins executing the procedure identified by the decay policy 204 immediately when receiving the data object 202. In some other implementations, the storage stack 200 begins executing a subset of the procedures identified by the decay policy 204 immediately when receiving the data object 202, and the remaining procedures identified by the decay policy 204 at the time point represented by the minimum time-to-live. The decay policy 204 can identify, for each procedure, a time point at which to begin executing the procedure. For example, a decay policy generation system, e.g., the decay policy generation system 110 depicted in FIG. 1, can select the time point at which each procedure should start being executed to achieve the acceptable probabilities of decay for the data object 202 at each time point after the data object 202 is written to the storage system 200, as described above.

In some implementations, in addition to enforcing the decay policy 204, the storage stack 200 can strictly enforce the lifetime of the data object 202 by deleting the data object 202 after the lifetime expires. For example, in implementations in which the lifetime of the data object 202 is defined by a single time-to-live value, the storage stack 200 can execute a delete command at the time point represented by the time-to-live. As another example, in implementations in which the lifetime of the data object 202 is defined by a minimum time-to-live value and a maximum time-to-live value, the storage stack 200 can execute a delete command at the time point represented by the maximum time-to-live. As a particular example, the storage stack 200 can execute a full scrub of the data object 202 at each layer of the storage stack 200, such that the data is completely unrecoverable. Nevertheless, even if the storage stack 200 executes a delete command at the end of the lifetime of the data object 202, implementing the decay policy 204 during the lifetime of the data object 202 can have the efficiency benefits described above.

In some implementations, if the storage stack 200 receives a read request for a data object that has already decayed (e.g., if the storage stack 200 receives the read request at a time point between a minimum time-to-live of the data object and a maximum time-to-live of the data object), then each layer of the storage stack 200 can pass (i) the decayed data object and (ii) an exception identifying that the data object is decayed to the next highest layer for further processing to attempt to recover the data object.

For example, the device layer 250 can obtain the data object and determine that the data object has decayed. The device layer 250 can pass the decayed data object and an exception to the RAID layer 240, which can attempt to recover the data object. If the RAID layer 240 fails to recover the data object, then the RAID layer 240 can pass the decayed data object and an exception to the file system layer 220, which can then attempt to recover the data object. If the file system layer 220 fails to recover the data object, then the file system layer 220 can pass the decayed data object and an exception to the application layer 210, which can then attempt to recover the storage object. In some implementations, a given layer of the storage system 200 can determine not to attempt to recover the data object (e.g., by determining that the data object is unrecoverable), and pass only an error to the next-highest layer in the storage stack 200.

If a respective layer of the storage stack 200 successfully recovers the data object, then the storage stack 200 can provide the recovered data object to the system that submitted the read request. If the storage stack 200 is not able to recover the data object, then the storage stack can provide an error to the system than submitted the read request, or provide the decayed data object and an exception identifying that the data object is decayed, so that the system that submitted the read request can determine whether to further attempt to recover the data object.

Figure 3:
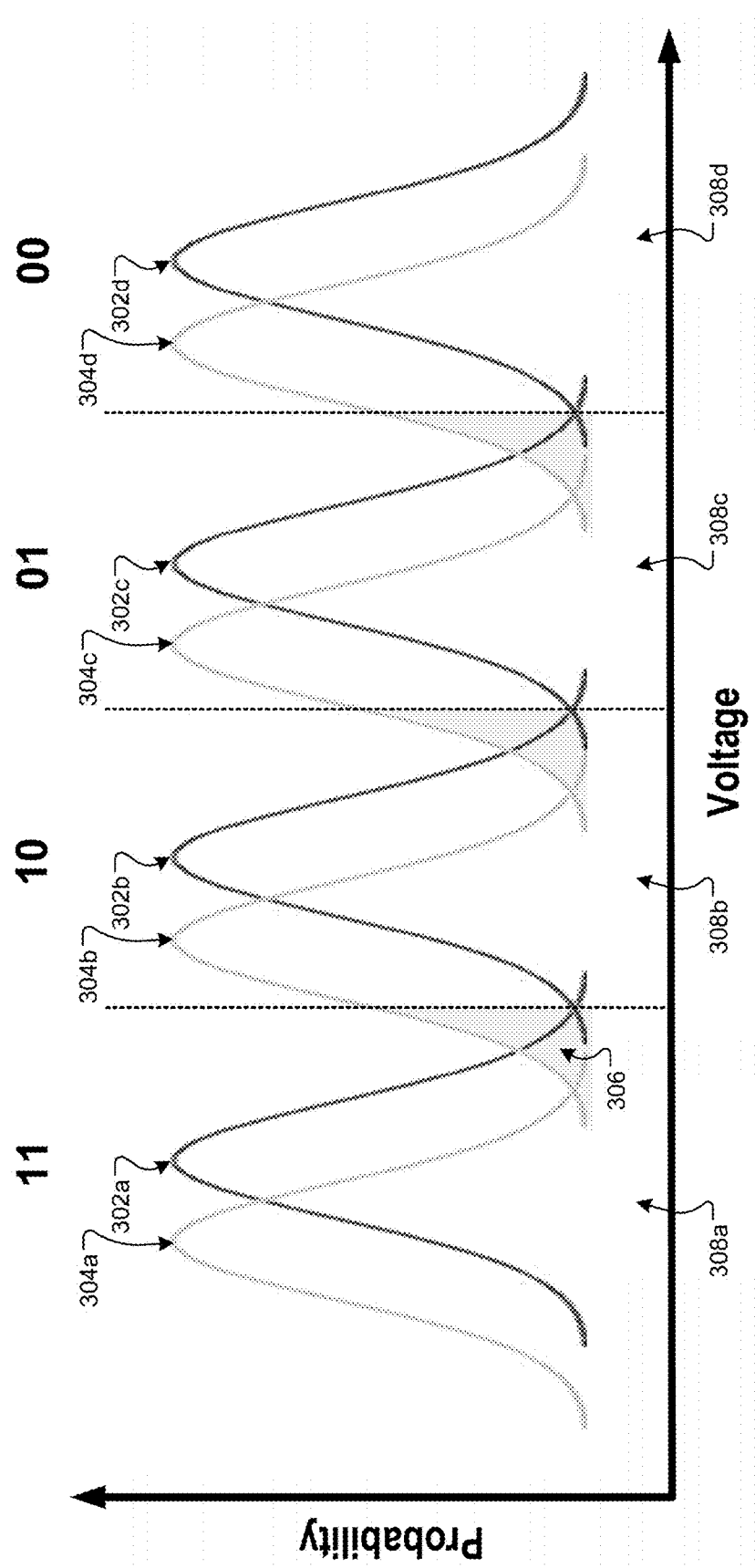
FIG. 3 is an illustration of an example voltage policy.

FIG. 3 is an illustration of an example voltage policy for a cell of a storage device. The cell of the storage device is configured to store two bits of a data object. That is, the cell can take one of four values: '11', '10', '01', or '00'. Generally, the cell of a storage device can be configured to store one or more bits of a data object, e.g., one, two, three, or four bits.

At the time point at which the data object is written to the storage device, the storage device can determine to provide the cell a different voltage depending on which value the cell is to take. The voltage that the storage device provides the cell is a distribution, i.e., the particular voltage that is actually provided is probabilistically distributed across a range of possible voltages. For example, referring to the graph illustrated in FIG. 3, if the value of the two bits is '11', then the storage device can determine to provide a voltage to the cell according to the distribution 302a. If the value of the two bits is '10', then the storage device can determine to provide a voltage to the cell according to the distribution 302*b*. If the value of the two bits is '01', then the storage device can determine to provide a voltage to the cell according to the distribution 302*c*. If the value of the two bits is '00', then the storage device can determine to provide a voltage to the cell according to the distribution 302*d*.

When the storage device reads the data object, the storage device can determine the value of the cell using the actual voltage of the cell. In particular, the storage device can determine the value of the cell to be the value corresponding to the region of the graph (illustrated as bounded by vertical dotted lines) in which the actual voltage lies. That is, if the actual voltage lies in the first region 308*a* of the graph (i.e., the region to the left of the first vertical dotted line), then the storage device can determine the value of the cell to be '11'. If the actual voltage lies in the second region 308*b* of the graph (i.e., the region between the first and second vertical dotted lines), then the storage device can determine the value of the cell to be '10'. If the actual voltage lies in the third region 308*c* of the graph (i.e., the region between the second and third vertical dotted lines), then the storage device can determine the value of the cell to be '01'. Finally, if the actual voltage lies in the fourth region 308*d* of the graph (i.e., the region to the right of the third vertical dotted line), then the storage device can determine the value of the cell to be '00'.

The portions of each distribution 302*a-d* that fall outside the corresponding region 308*a-d* represent "raw bit errors." That is, if the actual voltage of the cell lies in the portion of the respective distribution 302*a-d* that falls outside the corresponding region 308*a-d*, then the storage device will determine the incorrect value for the cell. In particular, the area under the portion of the distribution 302*a-d* that falls outside the corresponding region 308*a-d* characterizes the likelihood that the storage device will determine the incorrect value for the cell.

Generally, voltage of the cells of a storage device leak over time, so as time passes during the storage of the data object, the distributions 302*a-c* shift to the left. Thus, a read request of the data object submitted later in the life of the data object is more likely to include raw bit error, because a larger portion of each distribution 302*a-d* falls outside (i.e., to the left) of the corresponding region 308*a-d*.

A decay policy of a data object can establish the parameters of the distributions according to which the storage device will provide voltage to the cells storing the data object to enforce a lifetime of the data object. That is, the storage device can execute the decay policy so that the data object decays as required by the lifetime of the data object, as described above. For example, a decay policy generation system, e.g., the decay policy generation system 110 depicted in FIG. 1, can determine a particular number of bits of the data object that are required to decay for the data object itself to be considered decayed. The decay policy generation system can then determine parameters of the distributions such that, with a predetermined likelihood (e.g., 50%, 90%, or 99%, as identified by a user retention policy for the data object), at least the particular number of bits will experience a raw bit error at the expiration of the lifetime of the data object.

In particular, the decay policy generation system can generate a prediction of how the distributions will shift over time due to voltage leaks. The decay policy generation system can then determine an initial set parameters for the distributions (i.e., parameters corresponding to the time point at which the data object is written to the storage device) such that an updated set of parameters (corresponding to the time point at the expiration of the lifetime of the data object) will probabilistically cause the required raw bit error as described above.

For example, the decay policy can require that the storage device perform "undervolting," wherein a lower voltage is provided to the cells storing the data object than is typical (corresponding to a shift to the left of the distributions). In the example depicted in FIG. 3, the decay policy can define the parameters for the distributions 304*a-d*, which representing undervolting compared to the distributions 302*a-d*. Thus, the portions of the distributions 304*a-d* which fall outside of the corresponding regions 308*a-d* (e.g., the shaded region 306) correspond to raw bit errors.

The decay policy generation system can determine a relationship between the lifetime of a data object and the voltage distributions that will enforce the lifetime. In some implementations, this relationship will be different for each different storage device. This is because storage devices, even storage devices that are the same model, can be highly variable in their internal physics, and the rate at which voltage leaks within a storage device is typically not published by the manufacturers of the storage devices. Furthermore, the raw bit error rate of a storage device can be influenced by many factors, e.g., an age of the storage device, a current temperature of the storage device, etc.

In some implementations, for each storage device, the decay policy generation system can experimentally determine the relationship between the lifetime of a data object and the voltage distribution of the storage device that will enforce the lifetime. For example, the decay policy generation system can periodically execute a calibration procedure that measures the effect of undervolting the cells of the storage device, i.e., how the raw bit error rate of the storage device changes over time due to the initial distribution and voltage leaks. As a particular example, each storage device can allocate a small region of storage space (e.g., one or a few bytes) on the device for such an experimentation. The device can program the region to a predetermined value, provide a particular starting voltage to the region, and monitor the voltage over time.

Figure 4:
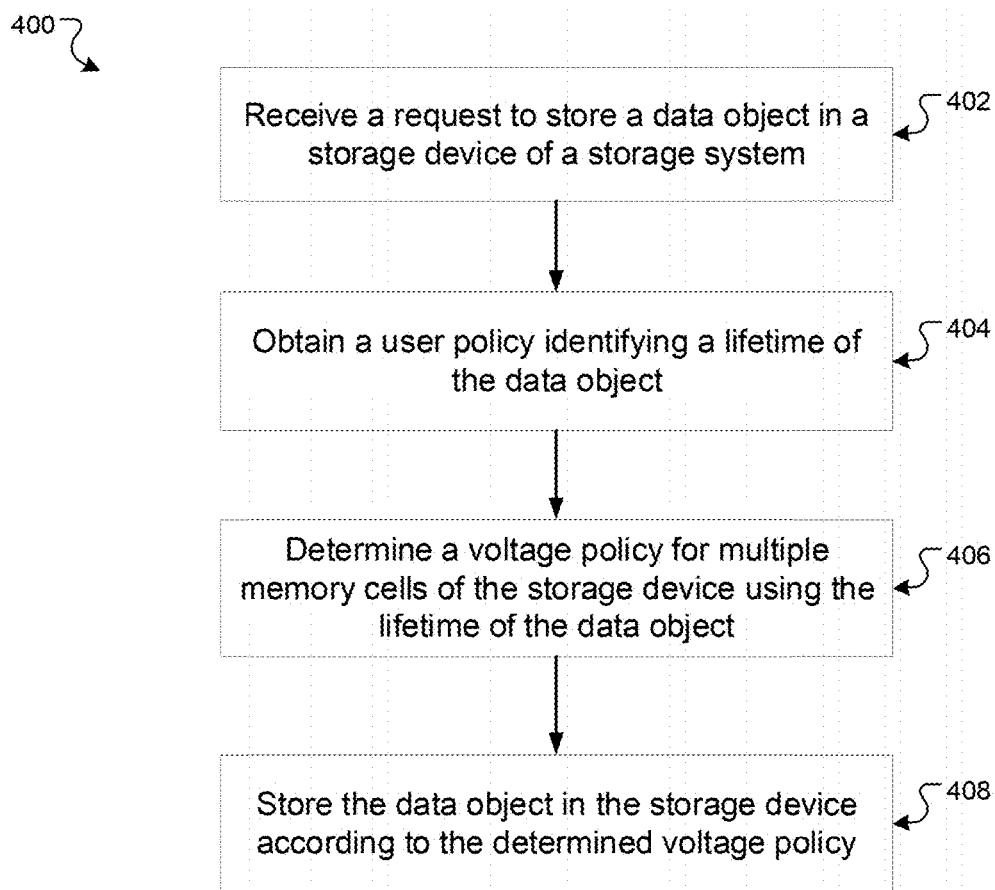
FIG. 4 is a flow diagram of an example process for generating a voltage policy for a data object.

FIG. 4 is a flow diagram of an example process 400 for generating a voltage policy for a data object. For convenience, the process 400 will be described as being performed by a system of one or more computers located in one or more locations. For example, a management system of a storage system, e.g., the storage system 100 depicted in FIG. 1, appropriately programmed in accordance with this specification, can perform the process 400.

The system receives a request to store the data object in a storage device of a storage system (step 402).

The system obtains a user policy identifying a lifetime of the data object (step 404). In some implementations, the lifetime of the data object identifies a single time-to-live value. In some other implementations, the lifetime of the data object identifies (i) a minimum time-to-live value and (ii) a maximum time-to-live value.

The system determines, using the lifetime of the data object, a voltage policy for multiple memory cells of the storage device (step 406). Each of the multiple memory cells will store one or more bits of the data object. The voltage policy can identify a voltage to provide each memory cell, such that an expected time at which raw bit errors of the data object will cause the data object to decay is equal to a time point identified by the lifetime of the data object.

In some implementations, determining the voltage policy includes determining the number of bits of the data object that must be incorrect for the data object to be considered decayed.

In some implementations, determining the voltage policy includes determining a relationship between (i) the voltage provided to a memory cell of the storage device and (ii) a likelihood that the memory cell will experience a raw bit error over time. That is, for each of one or more time points after the data object is written to the storage device, the relationship can identify a relationship between (i) the initial voltage provided to the memory cells storing the data object and (ii) the raw bit error rate at the time point. Thus, determining the voltage policy can include determining the initial voltage that causes the time point at which the data object is expected to decay (as a result of the raw bit errors in the memory cells) to be equal to the time point identified by the lifetime of the data object. For example, the relationship can be determined experimentally.

The system stores the data object in the storage device according to the determined voltage policy (step 408).

The voltage policy can represent one of multiple different procedures identified by a decay policy of the data object that enforces the lifetime of the data object. Each procedure of the decay policy can be executed by a respective component of the storage system.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non-transitory program carrier for execution by, or to control the operation of, data processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. The computer storage medium can be a machine-readable storage device, a machine-readable storage substrate, a random or serial access memory device, or a combination of one or more of them.

The term "data processing apparatus" refers to data processing hardware and encompasses all kinds of apparatus, devices, and machines for processing data, including by way of example a programmable processor, a computer, or multiple processors or computers. The apparatus can also be or further include special purpose logic circuitry, e.g., an FPGA (field programmable gate array) or an ASIC (application-specific integrated circuit). The apparatus can optionally include, in addition to hardware, code that creates an execution environment for computer programs, e.g., code that constitutes processor firmware, a protocol stack, a database management system, an operating system, or a combination of one or more of them.

A computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a computing environment. A computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A computer program can be deployed to be executed on one computer or on multiple computers that are located at one site or distributed across multiple sites and interconnected by a communication network.

For a system of one or more computers to be configured to perform particular operations or actions means that the system has installed on it software, firmware, hardware, or a combination of them that in operation cause the system to perform the operations or actions. For one or more computer programs to be configured to perform particular operations or actions means that the one or more programs include instructions that, when executed by data processing apparatus, cause the apparatus to perform the operations or actions.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Computers suitable for the execution of a computer program include, by way of example, can be based on general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer-readable media suitable for storing computer program instructions and data include all forms of non-volatile memory, media and memory devices, including by way of example semiconductor memory devices, e.g., EPROM, EEPROM, and flash memory devices; solid state drives, NVMe devices, persistent memory devices, magnetic disks, e.g., internal hard disks or removable disks; magneto-optical disks; and CD-ROM and DVD-ROM and Blu-ray discs. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and pointing device, e.g, a mouse, trackball, or a presence sensitive display or other surface by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's device in response to requests received from the web browser. Also, a computer can interact with a user by sending text messages or other forms of message to a personal device, e.g., a smartphone, running a messaging application, and receiving responsive messages from the user in return.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components. The components of the system can be interconnected by any form or medium of digital data communication, e.g., a communications network. Examples of communications networks include a local area network (LAN) and a wide area network (WAN), e.g., the Internet.

The computing system can include clients and servers. A client and server are generally remote from each other and typically interact through a communication network. The relationship of client and server arises by virtue of computer programs running on the respective computers and having a client-server relationship to each other. In some embodiments, a server transmits data, e.g., an HTML page, to a user device, e.g., for purposes of displaying data to and receiving user input from a user interacting with the device, which acts as a client. Data generated at the user device, e.g., a result of the user interaction, can be received at the server from the device.

In addition to the embodiments described above, the following embodiments are also innovative:

Embodiment 1 is a method comprising:
 receiving a request to store a data object in a storage device of a storage system;
 obtaining a user policy identifying a lifetime of the data object;
 determining, using the lifetime of the data object, a voltage policy for a plurality of memory cells of the storage device, wherein:
  each of the plurality of memory cells will store one or more bits of the data object;
  the voltage policy identifies a voltage to provide each memory cell; and
  an expected time at which raw bit errors of the data object will cause the data object to decay is equal to a time point identified by the lifetime of the data object; and
 storing the data object in the storage device according to the determined voltage policy.

Embodiment 2 is the method of embodiment 1, wherein determining the voltage policy comprises determining a number of bits of the data object that must be incorrect for the data object to be considered decayed, wherein the determined number of bits depends on a type of the data object.

Embodiment 3 is the method of any one of embodiments 1 or 2, wherein the voltage policy represents one of a plurality of procedures identified by a decay policy of the data object that enforces the lifetime of the data object, wherein each procedure of the decay policy is executed by a respective component of the storage system.

Embodiment 4 is the method of any one of embodiments 1-3, wherein the lifetime of the data object identifies a single time-to-live value that represents a time point after which the data object should be unavailable.

Embodiment 5 is the method of any one of embodiments 1-4, wherein the lifetime of the data object identifies (i) a minimum time-to-live value representing a time point before which the data object should be available and (ii) a maximum time-to-live value representing a time point after which the data object should be unavailable.

Embodiment 6 is the method of any one of embodiments 1-5, wherein determining the voltage policy comprises determining a relationship between (i) the voltage provided to a memory cell of the storage device and (ii) a likelihood that the memory cell will experience a raw bit error over time.

Embodiment 7 is the method of embodiment 6, wherein determining the relationship comprises, at each of multiple time points:
 experimentally providing multiple different voltages to respective memory cells of the storage system and identifying, for each different voltage, identifying an effect of providing the voltage on the likelihood that the respective memory cells will experience a raw bit error over time.

Embodiment 8 is a system comprising: one or more computers and one or more storage devices storing instructions that are operable, when executed by the one or more computers, to cause the one or more computers to perform the method of any one of embodiments 1 to 7.

Embodiment 9 is one or more non-transitory computer storage media encoded with a computer program, the program comprising instructions that are operable, when executed by data processing apparatus, to cause the data processing apparatus to perform the operations of any one of embodiments 1 to 7.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. For example, the subject matter is described in context of scientific papers. The subject matter can apply to other indexed work that adds depth aspect to a search. In some cases, the actions recited in the claims can be performed in a different order and still achieve desirable results. In addition, the processes described do not necessarily require the particular order shown, or sequential order, to achieve desirable results. In certain implementations, multitasking and parallel processing can be advantageous.

What is claimed is:

1. A method comprising:
receiving a request to store a data object in a storage device of a storage system;
obtaining a user policy identifying a lifetime of the data object;
determining, using the lifetime of the data object, a voltage policy for a plurality of memory cells of the storage device, wherein:
each of the plurality of memory cells will store one or more bits of the data object;
the voltage policy identifies a voltage to provide each memory cell; and
an expected time at which raw bit errors of the data object will cause the data object to decay is equal to a time point identified by the lifetime of the data object; and
storing the data object in the storage device according to the determined voltage policy.

2. The method of claim 1, wherein determining the voltage policy comprises determining a number of bits of the data object that must be incorrect for the data object to be considered decayed, wherein the determined number of bits depends on a type of the data object.

3. The method of claim 1, wherein the voltage policy represents one of a plurality of procedures identified by a decay policy of the data object that enforces the lifetime of the data object, wherein each procedure of the decay policy is executed by a respective component of the storage system.

4. The method of claim 1, wherein the lifetime of the data object identifies a single time-to-live value that represents a time point after which the data object should be unavailable.

5. The method of claim 1, wherein the lifetime of the data object identifies (i) a minimum time-to-live value representing a time point before which the data object should be available and (ii) a maximum time-to-live value representing a time point after which the data object should be unavailable.

6. The method of claim 1, wherein determining the voltage policy comprises determining a relationship between (i) the voltage provided to a memory cell of the storage device and (ii) a likelihood that the memory cell will experience a raw bit error over time.

7. The method of claim 6, wherein determining the relationship comprises, at each of multiple time points:
experimentally providing multiple different voltages to respective memory cells of the storage system and identifying, for each different voltage, identifying an effect of providing the voltage on the likelihood that the respective memory cells will experience a raw bit error over time.

8. A system comprising one or more computers and one or more storage devices storing instructions that are operable, when executed by the one or more computers, to cause the one or more computers to perform operations comprising:
receiving a request to store a data object in a storage device of a storage system;
obtaining a user policy identifying a lifetime of the data object;
determining, using the lifetime of the data object, a voltage policy for a plurality of memory cells of the storage device, wherein:
each of the plurality of memory cells will store one or more bits of the data object;
the voltage policy identifies a voltage to provide each memory cell; and
an expected time at which raw bit errors of the data object will cause the data object to decay is equal to a time point identified by the lifetime of the data object; and
storing the data object in the storage device according to the determined voltage policy.

9. The system of claim 8, wherein determining the voltage policy comprises determining a number of bits of the data object that must be incorrect for the data object to be considered decayed, wherein the determined number of bits depends on a type of the data object.

10. The system of claim 8, wherein the voltage policy represents one of a plurality of procedures identified by a decay policy of the data object that enforces the lifetime of the data object, wherein each procedure of the decay policy is executed by a respective component of the storage system.

11. The system of claim 8, wherein the lifetime of the data object identifies a single time-to-live value that represents a time point after which the data object should be unavailable.

12. The system of claim 8, wherein the lifetime of the data object identifies (i) a minimum time-to-live value representing a time point before which the data object should be available and (ii) a maximum time-to-live value representing a time point after which the data object should be unavailable.

13. The system of claim 8, wherein determining the voltage policy comprises determining a relationship between (i) the voltage provided to a memory cell of the storage device and (ii) a likelihood that the memory cell will experience a raw bit error over time.

14. The system of claim 13, wherein determining the relationship comprises, at each of multiple time points:
experimentally providing multiple different voltages to respective memory cells of the storage system and identifying, for each different voltage, identifying an effect of providing the voltage on the likelihood that the respective memory cells will experience a raw bit error over time.

15. One or more non-transitory computer storage media encoded with computer program instructions that when executed by a plurality of computers cause the plurality of computers to perform operations comprising:
receiving a request to store a data object in a storage device of a storage system;
obtaining a user policy identifying a lifetime of the data object;
determining, using the lifetime of the data object, a voltage policy for a plurality of memory cells of the storage device, wherein:
each of the plurality of memory cells will store one or more bits of the data object;

the voltage policy identifies a voltage to provide each memory cell; and an expected time at which raw bit errors of the data object will cause the data object to decay is equal to a time point identified by the lifetime of the data object; and storing the data object in the storage device according to the determined voltage policy.

16. The non-transitory computer storage media of claim 15, wherein determining the voltage policy comprises determining a number of bits of the data object that must be incorrect for the data object to be considered decayed, wherein the determined number of bits depends on a type of the data object.

17. The non-transitory computer storage media of claim 15, wherein the voltage policy represents one of a plurality of procedures identified by a decay policy of the data object that enforces the lifetime of the data object, wherein each procedure of the decay policy is executed by a respective component of the storage system.

18. The non-transitory computer storage media of claim 15, wherein the lifetime of the data object identifies a single time-to-live value that represents a time point after which the data object should be unavailable.

19. The non-transitory computer storage media of claim 15, wherein the lifetime of the data object identifies (i) a minimum time-to-live value representing a time point before which the data object should be available and (ii) a maximum time-to-live value representing a time point after which the data object should be unavailable.

20. The non-transitory computer storage media of claim 15, wherein determining the voltage policy comprises determining a relationship between (i) the voltage provided to a memory cell of the storage device and (ii) a likelihood that the memory cell will experience a raw bit error over time.

21. The non-transitory computer storage media of claim 20, wherein determining the relationship comprises, at each of multiple time points:

experimentally providing multiple different voltages to respective memory cells of the storage system and identifying, for each different voltage, identifying an effect of providing the voltage on the likelihood that the respective memory cells will experience a raw bit error over time.

* * * * *